United States Patent
Oron et al.

(10) Patent No.: US 8,270,443 B2
(45) Date of Patent: Sep. 18, 2012

(54) DIODE-PUMPED CAVITY

(75) Inventors: Ram Oron, Nes-Ziona (IL); Doron Nevo, Ra'anana (IL); Moshe Oron, Rehovot (IL)

(73) Assignee: Israel Aerospace Industries Ltd. (IL)

( * ) Notice: Subject to any disclaimer, the term of this patent is extended or adjusted under 35 U.S.C. 154(b) by 0 days.

(21) Appl. No.: 13/353,828

(22) Filed: Jan. 19, 2012

(65) Prior Publication Data

US 2012/0120975 A1    May 17, 2012

Related U.S. Application Data

(63) Continuation of application No. 12/159,412, filed as application No. PCT/IB2006/003942 on Dec. 20, 2006.

(60) Provisional application No. 60/754,371, filed on Dec. 28, 2005.

(51) Int. Cl.
 *H01S 3/042* (2006.01)
 *H01S 3/0941* (2006.01)

(52) U.S. Cl. ........... 372/36; 372/34; 372/41; 372/70; 372/72; 372/75

(58) Field of Classification Search ............. 372/34, 372/36, 41, 70, 72, 75
See application file for complete search history.

(56) References Cited

U.S. PATENT DOCUMENTS

| | | |
|---|---|---|
| 3,140,451 A | 7/1964 | Fox |
| 3,222,615 A | 12/1965 | Holly |
| 3,663,893 A | 5/1972 | Ostermayer, Jr. |
| 3,683,296 A | 8/1972 | Scalise |
| 3,684,980 A | 8/1972 | Kay |
| 3,821,663 A | 6/1974 | Brenner |
| 4,755,002 A | 7/1988 | Parrott |
| 4,756,002 A | 7/1988 | Ruggieri et al. |
| 4,794,615 A | 12/1988 | Berger et al. |
| 4,872,177 A | 10/1989 | Baer et al. |
| 4,924,474 A * | 5/1990 | Yagi et al. ........... 372/75 |
| 4,945,544 A | 7/1990 | Tanaka et al. |
| 4,969,155 A | 11/1990 | Kahan |
| 5,033,058 A | 7/1991 | Cabaret et al. |
| 5,050,173 A | 9/1991 | Hughes |
| 5,084,886 A | 1/1992 | Martin |

(Continued)

FOREIGN PATENT DOCUMENTS

CA    1303198    6/1992

(Continued)

OTHER PUBLICATIONS

Young, Hugh D., *University Physics*, 12th Ed., 1992, table 15-5, p. 43, Addison Wesley.

(Continued)

*Primary Examiner* — Patrick Stafford
*Assistant Examiner* — Michael Carter
(74) *Attorney, Agent, or Firm* — Oliff & Berridge, PLC

(57) ABSTRACT

A side-pumped, diode-pumped solid-state laser cavity includes a conductively cooled housing having an opening for pump radiation from a diode array in close proximity to a laser rod. The pump light is absorbed by the rod and excites the laser ions. The cavity includes a thin, diffuse reflector encircling the rod, having a shaped opening for the collection and redirection of the pump light into the rod, and a good heat conductor as the heat sink and heat conductor. A split heat sink inhibits the flow of heat from the pump diodes into the laser rod, and pre-formed air spacings are designed to provide uniform temperature distribution around the laser rod.

15 Claims, 2 Drawing Sheets

U.S. PATENT DOCUMENTS

| | | | |
|---|---|---|---|
| 5,117,436 A | 5/1992 | Hanson | |
| 5,140,607 A | 8/1992 | Paiva | |
| 5,159,605 A * | 10/1992 | Yagi et al. | 372/75 |
| 5,164,947 A | 11/1992 | Lukas et al. | |
| 5,317,585 A | 5/1994 | Gregor | |
| 5,349,600 A | 9/1994 | Shinbori et al. | |
| 5,455,838 A | 10/1995 | Heritier et al. | |
| 5,488,626 A | 1/1996 | Heller et al. | |
| 5,521,932 A | 5/1996 | Marshall | |
| 5,521,936 A | 5/1996 | Irwin | |
| 5,561,547 A | 10/1996 | Keirstead et al. | |
| 5,572,541 A | 11/1996 | Sumi | |
| 5,590,147 A | 12/1996 | Hobbs et al. | |
| 5,623,510 A | 4/1997 | Hamilton et al. | |
| 5,627,848 A | 5/1997 | Fermann et al. | |
| 5,627,850 A | 5/1997 | Irwin et al. | |
| 5,638,388 A | 6/1997 | Nighan, Jr. et al. | |
| 5,651,020 A | 7/1997 | Nighan, Jr. et al. | |
| 5,661,738 A | 8/1997 | Yasui et al. | |
| 5,677,920 A | 10/1997 | Waarts et al. | |
| 5,774,488 A | 6/1998 | Kmetec | |
| 5,781,580 A | 7/1998 | Winik | |
| 5,838,712 A | 11/1998 | Kraenert et al. | |
| 5,867,324 A | 2/1999 | Kmetec et al. | |
| 5,870,421 A | 2/1999 | Dahm | |
| 5,875,206 A | 2/1999 | Chang | |
| 5,905,745 A | 5/1999 | Grubb et al. | |
| 5,909,306 A | 6/1999 | Goldberg et al. | |
| 5,930,030 A | 7/1999 | Scifres | |
| 5,963,363 A | 10/1999 | Weston et al. | |
| 5,978,407 A | 11/1999 | Chang et al. | |
| 5,987,049 A | 11/1999 | Weingarten et al. | |
| 5,995,523 A | 11/1999 | Xie | |
| 6,002,695 A | 12/1999 | Alfrey et al. | |
| 6,009,114 A | 12/1999 | Heller et al. | |
| 6,026,109 A | 2/2000 | Micke et al. | |
| 6,347,101 B1 | 2/2002 | Wu et al. | |
| 6,608,852 B2 | 8/2003 | Govorkov et al. | |
| 2005/0180472 A1 | 8/2005 | Tzuk et al. | |
| 2006/0171429 A1* | 8/2006 | Seitel | 372/10 |
| 2006/0245460 A1* | 11/2006 | Luo et al. | 372/70 |

FOREIGN PATENT DOCUMENTS

| | | |
|---|---|---|
| EP | 0 377 207 | 5/1994 |
| EP | 0 798 827 A2 | 10/1997 |
| EP | 1 463 165 A1 | 9/2004 |
| FR | 1379289 | 12/1963 |
| FR | 2592530 | 12/1986 |
| GB | 2343990 | 5/2000 |
| JP | A-1-205484 | 8/1989 |
| JP | A-5-259540 | 10/1993 |
| WO | WO 9714200 | 4/1997 |

OTHER PUBLICATIONS

Thermal Conductivity, http://hyperphysics.phy-astr.gsu.edu/hbase/tables/thrcn.html, retrieved May 17, 2011.

Table, http://catalog.epoxyset.com/keyword/all-categories/ermally-conductive-potting-encapsulating-compounds?&plpver=10&pagesize=25&pagenum=l&filter=1&keyword=thermally+conductive+epoxy+compounds&key=product&keycateg=100&keyprod=1016&SchType=2&keyType=P, retrieved May 17, 2011.

"Thermally conductive polymers delete the heat," May 3, 2001, http://machinedesign.com/article/thermally-conductive-polymers-delete-the-heat-0503.

Lasance, C.J.M., "Thermal Conductivity of Filled Plastics," May 1, 2009, http://www.electronics-cooling.com/2009/05/thermal-conductivity-of-filled-plastics/.

Chen, Y., and Ting, J., "Ultra High Thermal Conductivity Polymer Composites," *Carbon 40*, 2002, pp. 359-362.

Guyer, E., *Handbook of Applied Thermal Design*, 1999, Table of Contents and Part 6, CRC Press, Boca Raton, FL.

"Norland Optical Adhesive 61," http://www.norlandprod.com/adhesives/noa61pg2.html, retrieved May 17, 2011.

Yoder, P.R., *Opto-mechanical systems design*, $2^{nd}$ Ed., revised and expanded, 1993, figure 3.13 and table 3.6, Marcel Dekker, Inc., New York.

Carniglia, C.K., "An Introduction to Mirrors", *The photonics Design and Applications Handbook*, 1999, pp. H-314-H-317.

"A Guide to Reflectance Coatings and Materials," Labsphere an X-rite company, 2004, pp. 1-25.

Labsphere catalogue, "Spectralon Reflectance Material," 1990.

"Diffuse Reflection," 2004, http://www.encyclopedia.com/topic/diffuse_reflection.aspx#1-1O11:diffusereflection-full.

"Diffuse reflection,"—http://en.wikipedia.org/wiki/Diffuse_reflection, retrieved May 17, 2011.

Dudzik, M. C., "Electro-Optical Systems Design, Analysis, and Testing", *The Infrared and Electro-Optical Systems Handbook*, 1993, vol. 4, pp. 318-320.

Pollock, D. H., "Countermeasure Systems", *The Infrared and Electro-Optical Systems Handbook*, 1993, vol. 7, p. 190.

Eckert, E.R.G, "Heat and Mass Transfer", *Introduction to the Transfer of Heat and Mass*, $2^{nd}$ ed., 1959, Introduction, McGraw-Hill Book Company, Inc., New York.

"What is Brushed Steel?," http://www.wisegeek.com/what-is-brushed-steel.htm, retrieved Aug. 31, 2010.

"Fundamentals of Rendering—Reflectance Functions", chapter 9 of *Physically Based Rendering*, 2004. http://www.cse.ohio-state.edu/~parent/classes/782/Lectures/05_Reflectance.pdf "Engineered Diffusers," *RPC Photonics*, http://www.rpcphotonics.com/engineered.asp, retrieved Aug. 31, 2010.

"DuPont Diffuse Light Reflector," http://www2.dupont.com/Diffuse_Light_Reflectors/en_US/assets/downloads/NOW801_DLR_Sell_Sheet_me05-21.pdf, retrieved Aug. 31, 2010.

"Nanoflex Optical Reflector," *INERGI*, http://web.archive.org/web/20090523010742/http://www.inergicorp.com/product.php?id=1, retrieved Aug. 31, 2010.

"Reflection (physics),"http://en.wikipedia.org/wiki/Reflection_(physics), retrieved Aug. 31, 2010.

"Dielectric Mirrors," *RP Photonics*, http://www.rp-photonics.com/dielectric_mirrors.html, retrieved Aug. 31, 2010.

Koechner, W., "Solid-state Laser Engineering," *Springer Series in Optical Sciences*, 1996, pp. 127-140 and 709, vol. 1, Springer-Verlag, Berlin, Heidelberg, New York.

Hanson, F. et al., "Laser Diode Side Pumping of Neodymium Laser Rods," *Applied Optics*, 1988, pp. 80-83, vol. 27, No. 1.

Ajer, H. et al., "Efficient diode-laser side-pumped TEM00-mode Nd:YAG laser," *Optics Letters*, 1992, pp. 1785-1787, vol. 17, No. 24.

Kasinski, J. J. et al., "One Joule Output From a Diode Array Pumped Nd:YAG Laser with Side-Pumped Rod Geometry," *J. of Quantum Electronics*, Apr. 1992, pp. 977-985, vol. 28, No. 4.

Golla, D. et al., "300-W cw Diode Laser Side-Pumped Nd:YAG Rod Laser, *Optics Letters*, May 15, 1995, pp. 1148-1150, vol. 20, No. 10.

Fujikawa et al., "High-Power High-Efficient Diode-Side-Pumped Nd:YAG Laser," *Trends in Optics and Photonics*, pp. 296-299, TOPS vol. X, Advance Solid-state Laser, Pollock and Bosenberg, eds., (Topical Meeting, Orlando, Florida, Jan. 27-29, 1997).

Pole, RN., "Digital Object Identifier," *IEEE Journal of Quantum Electronics*, Aug. 1966, 1 pg, vol. 2, issue 8.

Devlin et al., "Composite Rod Optical Masers," *Applied Optics*, Jan. 1962, pp. 11-15, vol. 1, No. 1.

Goldberg et al., "V-Groove Side-Pumped 1.5 um Fibre Amplifier," Electronics Letters, Dec. 4, 1997, pp. 2127-2129, vol. 33, No. 25.

Welford et al., "Efficient TEM00—Mode Operation of a Laser Diode Side-Pumped ND: YAG Laser," *Optics Letters*, Dec. 1, 1991, pp. 1850-1852, vol. 16, No. 23.

Welford et al., "Observation of Enhanched thermal Lensing Due to Near-Gaussian Pump Energy Deposition in a Laser Diode Side-Pumped Nd:YAG Laser," *IEEE Journal of Quantum Electronics*, Apr. 4, 1992, pp. 1075-1080, vol. 28, No. 4.

Walker et al., "Efficient continuous-wave TEM00 Operation of a Transversely Diode-Pumped Nd:YAG Laser," *Optics Letters*, Jul. 15, 1994, pp. 1055-1057, vol. 19, No. 4.

Comaskey et al., "24-W average power at 0.537 um From an Externally Frequency-Doubled Q-Switched Diode-Pumped ND:YOS Laser Oscillator," *Applied Optics*, Sep. 20, 1994, pp. 6377-6382, vol. 33, No. 27.

Nov. 24, 2009 European Search Report for European Patent Application No. 06 84 2370.

Sep. 7, 2010 Office Action issued in U.S. Appl. No. 12/159,412.
Mar. 4, 2011 Office Action issued in U.S. Appl. No. 12/159,412.
Oct. 12, 2011 Office Action issued in U.S. Appl. No. 12/159,412.

* cited by examiner

DIODE-PUMPED CAVITY

This is a Continuation of application Ser. No. 12/159,412 filed Dec. 17, 2008, which is a U.S. national phase of International Application No. PCT/IB2006/003942 filed Dec. 20, 2006, which claims the benefit of U.S. Provisional Application No. 60/754,371 filed Dec. 28, 2005. The disclosures of the prior applications are hereby incorporated by reference herein in their entirety.

FIELD OF THE INVENTION

The present invention relates to side-pumped, diode-pumped solid-state lasers, and more particularly to a cavity for diode side pumping of solid-state laser rods as oscillators or amplifiers.

BACKGROUND OF THE INVENTION

Energetic diode-pumped lasers use laser diodes in various geometries, mostly arranged around the laser rod, performing side pumping perpendicular to the rod axis. The light emitted by the laser diodes enters perpendicular to the rod axis. The pump light is absorbed by the atoms in the laser rod, exciting the atoms, thus establishing an optical gain in the laser rod. The side pumping geometry allows a large excited cross-section of the laser rod as well as long rod pumping, facilitating large pumped volume and large energy storage and high-energy extraction as required.

The side-pumped, diode-pumped solid-state laser (side-pumped DPSSL) field can be divided into sub-fields based on how the otherwise highly divergent, up to 40°, diode radiation is coupled into the laser rod. Some of these sub-fields include: (a) using optics such as a cylindrical lens or elliptical mirror, (b) using an optical waveguide such as a reflective cavity or fiber; and (c) closely coupling the diode(s) to the rod.

The side-pumped, diode-pumped solid-state laser (side-pumped DPSSL) field can be further divided into sub-fields based on how the heat, resulting from the method used to remove the part of the electric energy introduced into the cavity that is not transferred to laser light is removed. Some of these sub-fields include: (a) using liquid, circulating in and out of the cavity, where the excessive heat is convected away, (b) using gas, circulating in and out of the cavity, where the excessive heat is convected away, (c) using a solid-state structure, where the excessive heat is conducted away through the solid structure. Heat removal in most prior art arrangements and structures was performed using compressed gas of liquid coolants. Gas or liquid coolants limit the reliability of the laser system, since frequent preventive maintenance activity is required to address leaks of the coolant or degradation of its characteristics.

Japanese patent publication no. JP 5-259540 discloses a side-pumped DPSSL wherein the rod is disposed within a diffuse reflector or condenser. A diode array emits radiation that enters the condenser for absorption by the rod via a narrow slit which guides the diode radiation toward the rod. A gel or liquid such as water surrounds the rod filling spacing between the rod and surrounding tube. Some light is absorbed in the liquid, scattered and absorbed by multiple reflections.

U.S. Pat. Nos. 5,521,936, 5,033,058 and 6,026,109 disclose water-cooled solid-state lasers using closely coupled side-pumping diode arrays. The pumping laser diodes are disposed close to the rod in order that the rod remains in the path of the substantial portion of the divergent radiation, as it is not contemplated that rays missing the rod on the first pass will be subsequently redirected towards the rod to be absorbed on a second or later pass, the efficiency is reduced. U.S. Pat. No. 5,870,421 patent differs in that it discloses the use of side-pumping optical fibers, which add substantial manufacturing cost.

In addition, the alternative configurations described in U.S. Pat. Nos. 5,521,936, 5,033,058 and 6,026,109 include a rod which is cooled with a water jacket enclosed a flow tube, with the diodes and reflector disposed outside the flow tube, similarly to JP 5-259540. Here, a disadvantage is that the wall thickness of the flow tube adds significant distance between the rod and reflector. In configurations using a diffuse reflector, this leads to increased losses of the pump light, resulting in reduced efficiency.

U.S. Pat. No. 6,608,852 describes a liquid-cooled side-pumped laser including an elongated diffuse reflector housing having an elongated cavity defined by a diffusely reflective cavity wall, with a solid-state rod disposed within the cavity and surrounded by a cooling fluid flowing along the rod for cooling the rod. This laser has the advantage of uniform pumping, but the liquid cooling is problematic in various environmental conditions (like freezing).

In the close-coupled arrangement described in U.S. Pat. No. 5,774,488, the rod is enclosed in a heat-conducting specular reflector, and the pump radiation is introduced through a narrow slit in the reflector. This arrangement produces specular reflection, that causes non-uniform pumping of the rod cross section, and is complex to manufactures. Additionally, the specular reflector enhances the ASE (Amplified Spontaneous Emission) from the rod by providing parasitic laser paths. Additionally, any difference in thermal expansion of the rod and reflector may cause mechanical stress. Also, pump radiation from the diode must pass through a long narrow slit (channel) in the metal reflector, thus suffering multiple reflections and therefore extra losses.

Another problem is the type of reflector that can be used to pump light, while enabling uniform pumping of the rod cross section. Specular reflectors are not able to produce the same level of uniformity of the pump radiation as diffuse reflectors. For example, Hanson, et al., citation below, discloses a three-bar diode array placed a small distance away from a large opening to a solid-state laser cavity. Ajer et al., citation below, discloses a closely coupled side-pumping diode array which pumps the rod through a slit-like opening. The cavities disclosed by Hanson, et al. and Ajer, et al. include highly reflective inner surfaces, and the intensity distributions of the pumping diode radiation within the rods lack homogeneity.

Generally, pumping with a diode array from one direction can lead to a cylindrical intensity distribution (as shown, for example, in the paper by Hanson, et al.). This gives rise to a cylindrical thermal lens in the rod, which, in turn, results in an astigmatic output beam of the laser. To improve circularity, some of the mentioned references describe alternative arrangements which use pumping radiation from several (two or more) directions. The problem with this approach, however, is that laser diodes tend to age differently, which destroys the intensity balance over the lifetime of diodes.

In U.S. Pat. Nos. 5,317,585 and 5,781,580, a transparent heat conductor is used, since the heat conductor of these designs has to be optically transparent to allow the diode light to enter the laser rod and at the same time conductively cool the rod. High optical transparency and high thermal conductivity properties are not readily found in one material (except in diamond which is extremely expensive and cannot be machined to the needed shapes), and thus the solution is not optimized for any of the parameters.

Other references are:

Walter Koechner, "Solid-state Laser Engineering", pp. 127-140, 709 (Springer series in optical sciences, v. 1, Springer-Verlag, Berlin, Heidelberg, N.Y., 1996).

Frank Hanson and Delmar Haddock, "Laser diode side pumping of neodymium laser rods", Applied Optics, vol. 27, no. 1, 1988, pp. 80-83.

H. Ajer, et al., "Efficient diode-laser side-pumped TEM00-mode Nd:YAG laser", Optics Letters, vol. 17, no. 24, 1992, pp. 1785-1787.

Jeffrey J. Kasinski, et al., "One Joule Output From a Diode Array Pumped Nd:YAG Laser with Side-pumped Rod Geometry", J. of Quantum Electronics, Vol. 28, No. 4 (April 1992). D. Golla, et al., "300-W cw Diode Laser Side-pumped Nd:YAG Rod Laser", Optics Letters, Vol. 20, No. 10 (May 15, 1995).

Japanese Patent No. JP 5-259540.

U.S. Pat. Nos. 5,774,488, 5,521,936, 5,033,058, 6,026,109, 5,870,421, 5,117,436, 5,572,541, 5,140,607, 4,945,544, 4,969,155, 5,875,206, 5,590,147, 3,683,296, 3,684,980, 3,821,663, 5,084,886, 5,661,738, 5,867,324, 5,963,363, 5,978,407, 5,661,738, 4,794,615, 5,623,510, 5,623,510, 3,222,615, 3,140,451, 3,663,893, 4,756,002, 4,755,002, 4,794,615, 4,872,177, 5,050,173, 5,317,585, 5,349,600, 5,455,838, 5,488,626, 5,521,932, 5,590,147, 5,627,848, 5,627,850, 5,638,388, 5,651,020, 5,838,712, 5,875,206, 5,677,920, 5,781,580, 5,905,745, 5,909,306, 5,930,030, 5,987,049, 5,995,523, 6,009,114, and 6,002,695.

German Patent No. DE 689 15 421 T2.

Canadian Patent No. 1,303,198.

French Patents Nos. 1,379,289 and 2,592,530.

Fujikawa, et al., "High-Power High-Efficient Diode-Side-Pumped Nd:YAG Laser", Trends in Optics and Photonics, TOPS Volume X, Advanced Solid-state Lasers, Pollock and Bosenberg, eds., (Topical Meeting, Orlando, Fla., Jan. 27-29, 1997).

R. V. Pole, IBM Technical Disclosure Bulletin, "Active Optical Imaging System", Vol. 7, No. 12 (May 1965).

Devlin, et al., "Composite Rod Optical Masers", Applied Optics, Vol. 1, No. 1 (January 1962).

Goldberg et al., "V-groove side-pumped 1.5 um fibre amplifier," Electronics Letters, Vol. 33, No. 25, Dec. 4, 1997).

Welford, et al., "Efficient TEM00-mode operation of a laser diode side-pumped Nd:YAG laser, Optics Letters, Vol. 16, No. 23 (Dec. 1, 1991).

Welford, et al., "Observation of Enhanced Thermal Lensing Due to Near-Gaussian Pump Energy Deposition in a Laser Diode Side-Pumped Nd:YAG Laser," IEEE Journal of Quantum Electronics, Vol. 28, No. 4 (Apr. 4, 1992).

Walker, et al., "Efficient continuous-wave TEM00 operation of a transversely diode-pumped Nd:YAG laser," Optics Letters, Vol. 19, No. 14 (Jul. 15, 1994).

Comaskey et al., "24-W average power at 0.537 um from an externally frequency-doubled Q-switched diode-pumped ND:YOS laser oscillator," Applied Optics, Vol. 33, No. 27 (Sep. 20, 1994).

Novel solutions allowing efficient side pumping, uniform pump distribution across the rod, pumping with a single source and one side and good conductive cooling are needed and are presented in this invention. The optimization of the mentioned parameters results in smaller volumes and weight as well.

SUMMARY OF THE INVENTION

It is therefore a broad object of the present invention to provide a side-pumped, diode-pumped solid-state laser cavity including a conductively cooled housing, having an opening for the pump radiation emerging from a diode array in close proximity and having a solid-state, diffuse reflector surrounding the laser rod. The pump light is absorbed by the rod and excites the laser ions. The pump-light that transverses the rod without absorption is redirected into it by the diffuse reflector.

It is a further object of the present invention to provide a side-pumped diode-pumped solid-state laser cavity where the rod is encircled by a thin, diffuse reflector that functions to redirect the pump-light that transverses the rod without absorption back into the rod. The reflector also has a shaped opening to redirect the pump light coming out at large angle into the rod, and serves as a good heat conductor to the heat sink.

It is still a further object of the present invention to provide a side-pumped, diode-pumped solid-state laser cavity including a split heat sink which significantly reduces the flow of heat from the pump diodes into the laser rod through either the diode itself or the common heat sink.

It is still a further object of the present invention to provide a side-pumped, diode-pumped solid-state laser cavity including a thermo electric cooler element as a conductive heat pump.

It is still a further object of the present invention to provide a side-pumped, diode-pumped solid-state laser cavity is including a pre-formed air spacing designed to provide uniform temperature distribution around the laser rod.

It is still a further object of the present invention to provide a diode pumping cavity for a laser system which efficiently couples the diode light into the laser rod directly, without using focusing lenses, prisms or windows, using only free air transmission and side redirection of large-angle pump beams.

It is still a further object of the present invention to provide very efficient conductive cooling of the laser rod. Conductive cooling is carried out through a thin ceramic heat conductor, into a very good metallic heat conductor. The ceramic heat conductor is positioned opposite the diode array, and is also used as a light redirector. The unabsorbed diode light is redirected by the ceramic material back into the laser rod.

It is still a further object of the present invention to provide enhancement of the radially symmetrical heat dissipation from the laser rod by adjusting the shape of the thermal conductor and using machined air spacings to control heat conduction.

It is still a further object of the present invention to provide optical proximity between pump diodes and a laser rod while maintaining thermal isolation, since most of the heat (about 50% of the input energy) is dissipated in the pump diode stack, and only a small portion in the rod (about 10% of the input energy).

A side-pumped, diode-pumped solid-state laser cavity is provided including a conductively cooled housing having an opening for pump radiation from a diode array in close proximity to a laser rod. The pump light is absorbed by the rod and excites the laser ions. The cavity includes a thin, diffuse reflector encircling the rod, having a shaped opening for the collection and redirection of the pump light into the rod, and a good heat conductor as the heat sink and heat conductor.

The cavity can also include a split heat sink that inhibits the flow of heat from the pump diodes into the laser rod, and pre-formed air spacings designed to provide uniform temperature distribution around the laser rod.

In one embodiment, a side-pumped diode-pumped solid-state laser cavity includes a conductively cooled housing, having a solid-state, diffuse reflector surrounding the laser rod. The pump light passes through an opening in the diffuse reflector, into the rod in close proximity, and is absorbed by the rod and excites the laser ions. The pump-light that transverses the rod without absorption is redirected into the rod by the diffuse reflector.

The laser rod is preferably conductively cooled. The reflector is preferably of diffuse type and placed as close to the rod as possible. The pump radiation preferably comes from one source, but still produces a circularly symmetrical intensity distribution inside the rod.

The higher the optical pumping efficiency of the laser rod, the less the thermal loading of the laser rod, resulting in a higher optical quality of the rod and a better output beam quality. In addition, high-efficiency pumping reduces the number of diode arrays required to obtain a specified laser energy output, reducing further the size and the cost of the laser system. Smaller size, less input power and better laser output quality can be achieved.

High pumping efficiency is achieved by good optical coupling of the diode light into the laser rod and adequate absorption of the diode light in the laser rod. The angular divergence of the diode light in the transverse plane is about 40°, and thus, a substantial fraction of the light will miss the laser rod. In addition, another fraction of the light will be lost due to Fresnel reflections caused by the high index of refraction and small diameter of the laser rod. Any focusing lenses which can be used to focus the diode light into the laser rod will cause light losses, due to limited lens aperture and optical lens coatings. For example, in U.S. Pat. Nos. 4,755,002 and 4,969,155, due to the mentioned problems of coupling linear diode arrays into the laser rod, focusing lenses were utilized perceptively, reducing the optical coupling efficiency.

BRIEF DESCRIPTION OF THE DRAWINGS

The invention will now be described in connection with certain preferred embodiments and with reference to the following illustrative figures so that it may be more fully understood. The particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings.

DETAILED DESCRIPTION OF PREFERRED EMBODIMENTS

Figure 1:
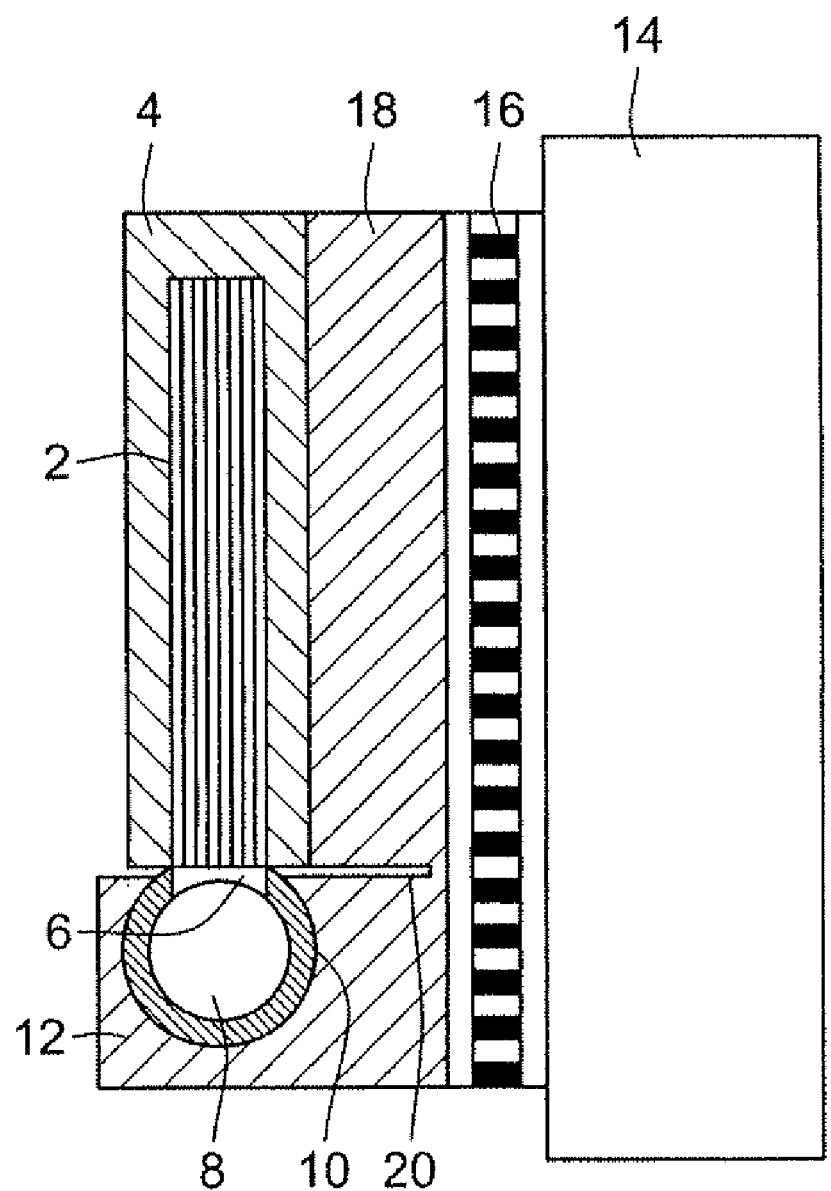
FIG. 1 is a schematic, cross-sectional view of a side-pumped, diode-pumped solid-state laser cavity.

Referring now to FIG. 1, there is shown a schematic, cross-sectional view of a side-pumped, diode-pumped solid-state laser cavity. A diode laser stack 2 embedded in a heat-conducting cladding 4 emits pump light through a lower opening 6 into a laser rod 8, which can be, e.g., Nd:YAG or any other solid-state crystal-doped with rare earth ions. The rare earth ions, e.g., Nd, are excited by the pump light and emit their typical radiation when needed. The laser rod 8 is surrounded by a ceramic diffuse reflector 10 having three roles. The first role is redirecting the pump light photons that pass through the laser rod 8 without being absorbed, or miss the rod geometrically. These photons are redirected in a diffuse way and go back and forth until absorbed in the rod 8. Regular ceramics like alumina (Al oxide) or Zr oxide have very high reflection coefficients, (higher than metal coatings such as gold or silver) and are very efficient in preserving the photons inside the rod volume. The second role of the ceramic diffuse reflector 10 is to conduct the heat dissipated into the rod 8 by the pump light 2 into a heat sink part 12, through which the heat is carried out to the external environment 14 via thermo electric cooler (TEC), 16. This heat conduction is performed through a short distance of ceramic in the reflector 10 (e.g., 0.2 to 1 mm of alumina) and a longer path (e.g., 10 to 15 mm) in the heat sink 12, which can be made of a material (e.g., copper), having much higher thermal conductively than alumina. The third role of the ceramic diffuse reflector 10 is to redirect light from the stack 2 into the rod 8, as depicted in detail in FIG. 2. Between the diode cladding 4 and the TEC 16 is a copper or good heat-conducting spacer 18 formed as part of the combined rod-pump heat sink. The space 18 keeps the mechanical assembly rigid and isolates thermally the diode part, where it provides good optical proximity between the pump diodes 2 and the laser rod 8 while maintaining thermal isolation through a small (few hundred micrometers) spacing or gap 20. This isolation is desirable since most of the heat (about 50% of the input energy) is dissipated in the pump diode stack 2, and only a small portion in the rod 8 (about 10% of the input energy).

Figure 2:
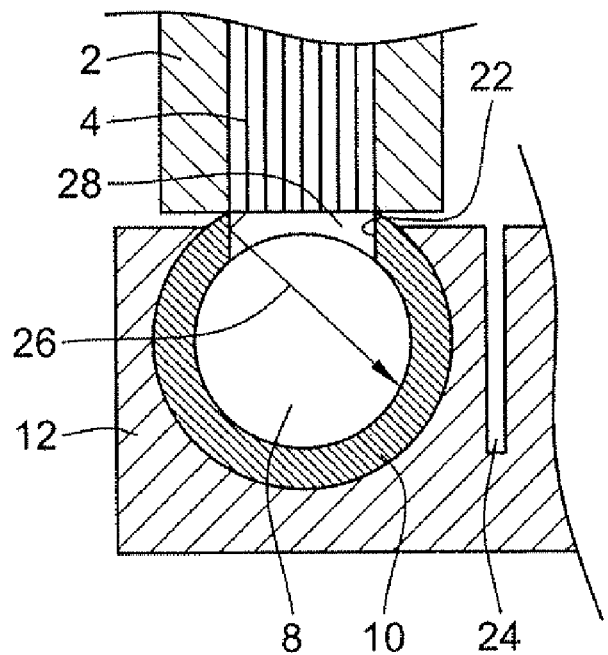
FIG. 2 is a schematic, cross-sectional view of the rod surroundings in the side-pumped diode-pumped, solid-state laser cavity

In FIG. 2, there is shown a schematic, cross-sectional view of the rod surroundings of the side-pumped diode-pumped, solid-state laser cavity. Here the light rays 26 leaving the lower exit of the diode stack 2 in large angle (which can be up to) 40° are redirected when impinging on the outer slit 22 of the ceramic diffuse reflector 10. The redirection is carried out by diffuse reflection at 22. Recalling that the thickness of the ceramic diffuse reflector 10 is 0.2 to 1 mm, the amount of light impinging on 22 is small. The gap 28 is empty (e.g., air, nitrogen or vacuum), and thus does not interfere in the optical path, needs no lenses or prisms for redirection and provides a good thermal barrier because only line edges of the ceramic diffuse reflector 10 touch the cladding 4, as depicted in FIG. 2. Further tailoring of the temperature profile around the rod 8 is done by cutting (e.g. using wire spark erosion techniques) lines 24, straight or curved, according to heat flow simulations of the heat sink 12 and the rod 8 as a heat source.

Figure 3:
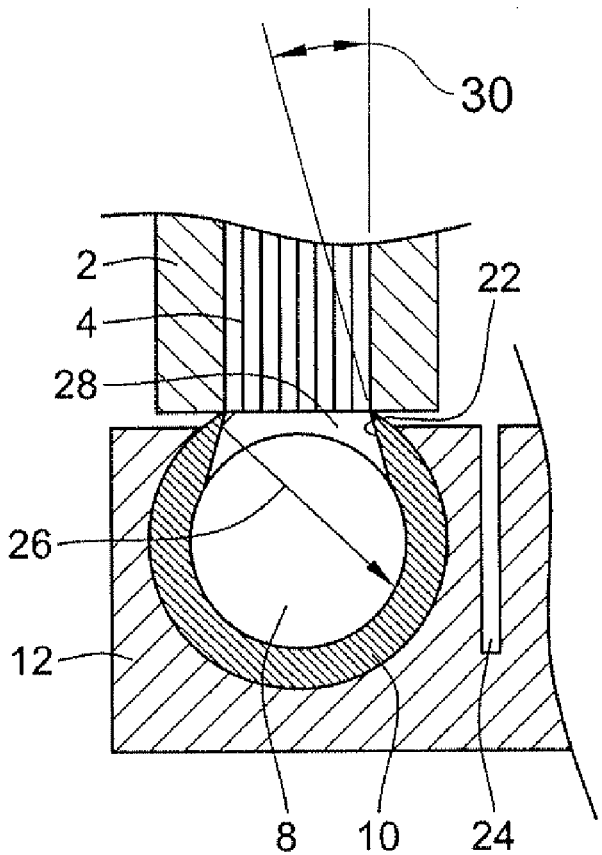
FIG. 3 is a schematic, cross-sectional view of the rod surroundings of the side-pumped diode-pumped solid-state laser cavity with emphasis on the entrance reflector.

FIG. 3 is a schematic, cross-sectional view of the rod surroundings of the side-pumped diode-pumped solid-state laser cavity with a modified entrance reflector. Here the angle 30 is designed to accommodate the large angle output of the diode, at its external part, leading it mostly into the rod 8 using diffuse reflection of the area 22. The angle 30 is preferably less than the divergence angle of the diodes in the air space 28.

It will be evident to those skilled in the art that the invention is not limited to the details of the foregoing described and illustrated embodiments and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes, which come within the meaning and range of equivalency of the claims, are therefore intended to be embraced therein.

What is claimed is:

1. A side-pumped, diode-pumped solid-state laser cavity comprising:
   at least one pump laser diode;
   a laser rod;
   a conductively cooled housing having an opening for pump radiation from the at least one pump laser diode, the conductively cooled housing including a first portion in which the laser rod is disposed, and a second portion in which the at least one pump laser diode is disposed;
   a solid-state, ceramic, heat conducting, diffuse reflector surrounding the laser rod;
   a pre-formed empty space between the laser rod and the at least one pump laser diode, the pre-formed empty space separating the first and second portions of the conductively cooled housing, and
   at least one machined air spacing extending from the pre-formed empty space into the first portion of the conductively cooled housing in which the laser rod is disposed, wherein
   at least the pre-formed empty space provides uniform temperature distribution around the laser rod.

2. The side-pumped, diode-pumped solid-state laser cavity as in claim 1, wherein the laser rod is encircled by the diffuse reflector, which (1) redirects pump-light that traverses the laser rod without absorption back into the laser rod, (2) redirects the pump light coming out of the at least one pump laser diode at a large angle into the laser rod, and (3) serves as a heat conductor to a heat sink.

3. The side-pumped, diode-pumped solid-state laser cavity as in claim 1, further comprising a thermo electric cooler element as a conductive heat pump.

4. The side-pumped, diode-pumped solid-state laser cavity as in claim 1, wherein light from the at least one pump laser diode is directly coupled into the laser rod, without using focusing lenses, prisms or windows, using only free space transmission and side, angled, diffuse or specular, redirection of large angle pump beams.

5. The side-pumped, diode-pumped solid-state laser cavity as in claim 1, wherein conductive cooling is carried out through a thin ceramic thermal conductor, into a metallic heat conductor.

6. The side-pumped, diode-pumped solid-state laser cavity as in claim 5, wherein enhancement of radially symmetrical heat dissipation from the laser rod is done by adjusting a shape of the thin ceramic thermal conductor and using the at least one machined air spacing to control heat conduction.

7. The side-pumped, diode-pumped solid-state laser cavity as in claim 1, wherein the conductively cooled housing is configured so as to provide optical proximity between the at least one pump laser diode and the laser rod while maintaining thermal isolation between the at least one pump laser diode and the laser rod.

8. A method for diode side pumping of solid-state laser rods, comprising:
   side pumping light from at least one pump laser diode through an opening of a housing into a laser rod, the housing including a first portion in which the laser rod is disposed, and a second portion in which the at least one pump laser diode is disposed;
   redirecting pump-light that traverses the laser rod without absorption back into the laser rod with a solid-state, ceramic, heat conducting, diffuse reflector;
   conductively cooling the housing by providing a pre-formed empty space between the laser rod and the at least one pump laser diode, the pre-formed empty space separating the first and second portions of the housing; and
   controlling heat conduction from the first portion of the housing by providing machined air spacings that extend from the pre-formed empty space into the first portion of the housing in which the laser rod is disposed, wherein
   at least the pre-formed empty space provides uniform temperature distribution around the laser rod.

9. The method of claim 8, further comprising:
   redirecting the pump light coming out of the at least one pump laser diode at a large angle into the laser rod.

10. The method of claim 8, further comprising:
    inhibiting the flow of heat from the at least one pump laser diode into the laser rod.

11. The method of claim 8, further comprising:
    providing a thermo electric cooler element as a conductive heat pump.

12. The method of claim 8 wherein light from the at least one pump laser diode is directly coupled into the laser rod, without using focusing lenses, prisms or windows, using only free space transmission and side, angled, diffuse or specular, redirection of large angle pump beams.

13. The method of claim 8, wherein
    the conductive cooling is carried out through a thin ceramic thermal conductor, into a metallic heat conductor.

14. The method of claim 13, further comprising:
    adjusting a shape of the thin ceramic thermal conductor to enhance radially symmetrical heat dissipation from the laser rod.

15. The method of claim 8, further comprising:
    providing optical proximity between the at least one pump diode and the laser rod while maintaining thermal isolation between the at least one pump laser diode and the laser rod.

* * * * *